US012772585B2

(12) United States Patent
Yamagata et al.

(10) Patent No.: US 12,772,585 B2
(45) Date of Patent: Oct. 20, 2026

(54) HERMETIC PACKAGE DEVICE AND DEVICE MODULE

(71) Applicant: Mitsubishi Electric Corporation, Tokyo (JP)

(72) Inventors: Yusuke Yamagata, Tokyo (JP); Takayuki Kato, Tokyo (JP); Tomohiro Maegawa, Tokyo (JP); Yoshinori Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 362 days.

(21) Appl. No.: 18/551,178

(22) PCT Filed: May 12, 2021

(86) PCT No.: PCT/JP2021/018068

§ 371 (c)(1),
(2) Date: Sep. 18, 2023

(87) PCT Pub. No.: WO2022/239153

PCT Pub. Date: Nov. 17, 2022

(65) Prior Publication Data

US 2024/0178247 A1 May 30, 2024

(51) Int. Cl.
*H10F 39/00* (2025.01)

(52) U.S. Cl.
CPC .................................. *H10F 39/804* (2025.01)

(58) Field of Classification Search
CPC ...................................................... H10F 39/804
See application file for complete search history.

(56) References Cited

U.S. PATENT DOCUMENTS 6,479,320 B1 11/2002 Gooch
6,521,477 B1 2/2003 Gooch et al.
(Continued)

FOREIGN PATENT DOCUMENTS

CN 102291099 A 12/2011
CN 102549749 A 7/2012
(Continued)

OTHER PUBLICATIONS ip.com search history (Year: 2026).*
(Continued)

*Primary Examiner* — Dale E Page
*Assistant Examiner* — Andre C Stevenson
(74) *Attorney, Agent, or Firm* — Studebaker Brackett PLLC

(57) ABSTRACT

A hermetic package device comprises a device wafer in which a semiconductor circuit and bonding pads are provided on a mounting surface, a lid wafer arranged to be opposed to the device wafer, and a sealing part that forms an hermetically sealed space in a vacuum atmosphere to house the semiconductor circuit between the device wafer and the lid wafer. A second installation region in which the bonding pads are provided in the mounting surface protrudes relative to the lid wafer, and an outer surface of a portion in the sealing part facing the second installation region is inclined such that a position thereon approaches the second installation region when getting closer from the device wafer toward the lid wafer.

20 Claims, 7 Drawing Sheets

(56) References Cited

U.S. PATENT DOCUMENTS

| | | | | |
|---|---|---|---|---|
| 10,431,509 | B2 * | 10/2019 | Kapusta | H10W 76/60 |
| 2002/0000646 | A1 | 1/2002 | Gooch et al. | |
| 2007/0190747 | A1 | 8/2007 | Humpston et al. | |
| 2008/0230885 | A1 * | 9/2008 | Wang | H10W 76/60<br>257/E23.18 |
| 2009/0114441 | A1 | 5/2009 | Hashimoto | |
| 2010/0084752 | A1 * | 4/2010 | Horning | B81B 7/0038<br>257/E23.18 |
| 2011/0062534 | A1 | 3/2011 | Hashimoto | |
| 2011/0228643 | A1 | 9/2011 | Aratake | |
| 2012/0086088 | A1 | 4/2012 | Hashimoto | |
| 2012/0097415 | A1 | 4/2012 | Reinert et al. | |
| 2014/0083735 | A1 | 3/2014 | Kohda et al. | |
| 2015/0334845 | A1 * | 11/2015 | Niino | H01L 23/26<br>174/255 |
| 2019/0361180 | A1 * | 11/2019 | Lam | G02B 6/4251 |

FOREIGN PATENT DOCUMENTS

| | | | |
|---|---|---|---|
| JP | 2003-531475 | A | 10/2003 |
| JP | 2011-199065 | A | 10/2011 |
| JP | 2018-054496 | A | 4/2018 |
| WO | 2012/128210 | A1 | 9/2012 |

OTHER PUBLICATIONS

An Office Action mailed by the Japanese Patent Office on Jun. 11, 2024, which corresponds to Japanese Application No. 2023-520657 with English translation.

International Search Report issued in PCT/JP2021/018068; mailed Jul. 27, 2021.

An Office Action issued by the China National Intellectual Property Administration on Aug. 19, 2026, corresponding to Chinese Patent Application No. 202180097817.3 and relating to U.S. Appl. No. 18/551,178, with English translation.

* cited by examiner

HERMETIC PACKAGE DEVICE AND DEVICE MODULE

TECHNICAL FIELD

The present application relates to a hermetic package device and a device module.

BACKGROUND ART

Micro Electro Mechanical Systems (MEMS) devices, which are devices in which sensors, actuators, etc. are integrated on a silicon substrate, etc. by microfabrication technology, have been put into practical use. Examples of MEMS devices include an infrared sensor, a gyro sensor, an accelerometer, and the like.

Among infrared sensors, an uncooled infrared sensor converts incoming infrared light into heat, as referred to as a thermal sensor. Therefore, the sensor (image sensing element) has a configuration in which a temperature change of a target object is read out as a change of an electric signal, and has an adiabatic structure that is thermally isolated from a base material in order to increase the detection sensitivity. Specifically, the infrared sensor is disposed in a hermetically sealed vacuum space, that is, inside a vacuum package, to enhance the thermal insulation. In this case, it is known that a material used as a lid of the vacuum package is ZnS or silicon containing low oxygen with high infrared transmittance, or an anti-reflection coating (AR coating) is formed on the material.

On the other hand, as a method of manufacturing a vacuum package, a wafer-level package has been proposed in which a device wafer on which MEMS devices are manufactured and a lid wafer facing the device wafer are bonded in a vacuum atmosphere to form a plurality of vacuum packages (Refer to, for example, Patent Document 1).

CITATION LIST

Patent Document

Patent Document 1: Japanese Patent Application Laid-Open No. 2003-531475 (paragraphs 0010 to 0015, FIG. 1 to FIG. 4)

SUMMARY OF INVENTION

Problems to be Solved by Invention

A device formed using the wafer-level package inevitably has a structure in which bonding pads for electrical connection provided on the device wafer are exposed from the lid wafer, and the part for the bonding in the device wafer protrudes relative to the lid wafer. In such a structure where one side thereof protrudes, there have been problems in which stress concentration occurs in a portion where the sealing part on the protruding side of the device wafer is in contact with the device wafer, causing cracks in the device wafer and malfunction of the device due to circuit breakage, wiring disconnection, etc.

The present application discloses a technology to solve the above problems, and an object thereof is to prevent device wafer cracking and obtain a highly reliable hermetic package device.

Means for Solving Problems

A hermetic package device disclosed in the present application includes a device wafer in which a semiconductor circuit and terminals for electrical connection to an outside are provided on a mounting surface, a lid wafer arranged to be opposed to the mounting surface of the device wafer, and a sealing part that surrounds an installation region of the semiconductor circuit in the mounting surface, is interposed between the device wafer and the lid wafer, and forms a hermetically sealed space in a vacuum atmosphere to house the semiconductor circuit between the device wafer and the lid wafer. A second installation region in the mounting surface in which the terminals are provided protrudes relative to the lid wafer, and an outer surface of a portion in the sealing part facing the second installation region is inclined such that a position thereon approaches the second installation region when getting closer from the device wafer toward the lid wafer.

Advantageous Effect of Invention

According to the hermetic package device or device module disclosed in the present application, the stress at the portion where the sealing part is in contact with the device wafer can be relieved, so that cracking of the device wafer can be prevented and a highly reliable hermetic package device can be obtained.

MODE FOR CARRYING OUT INVENTION

Hereinafter, hermetic package devices according to embodiments of the present application are described on the basis of the drawings. Note that, in the following drawings, the same or corresponding parts will be given the same reference number and the description thereof will not be repeated.

Embodiment 1

Figure 1A:
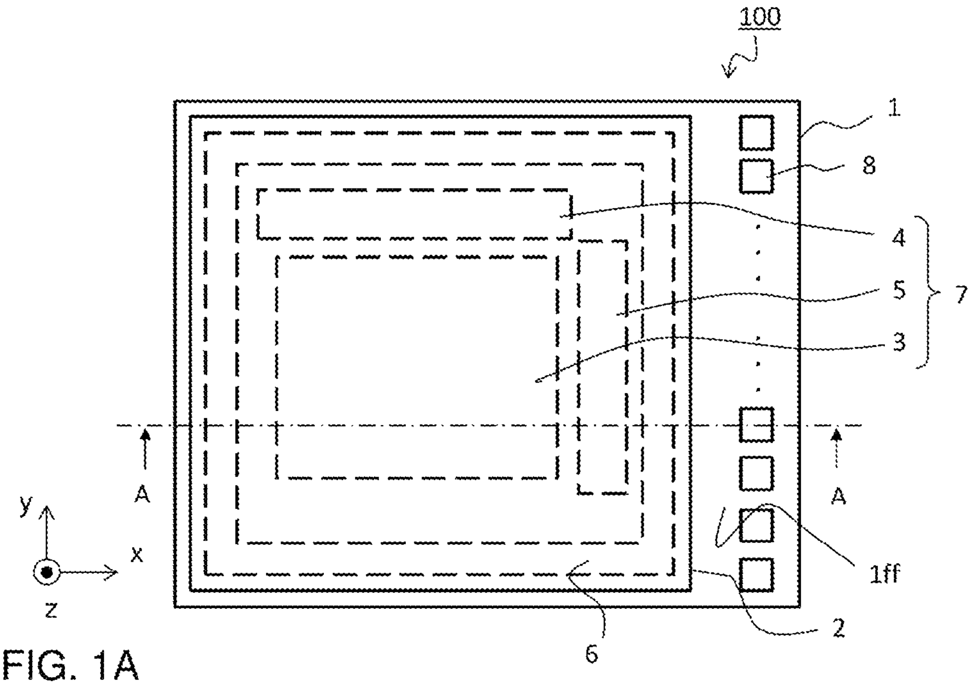
FIG. 1A and FIG. 1B are a plan view and a cross-sectional view, respectively, of a hermetic package device according to Embodiment 1.
Figure 1B:
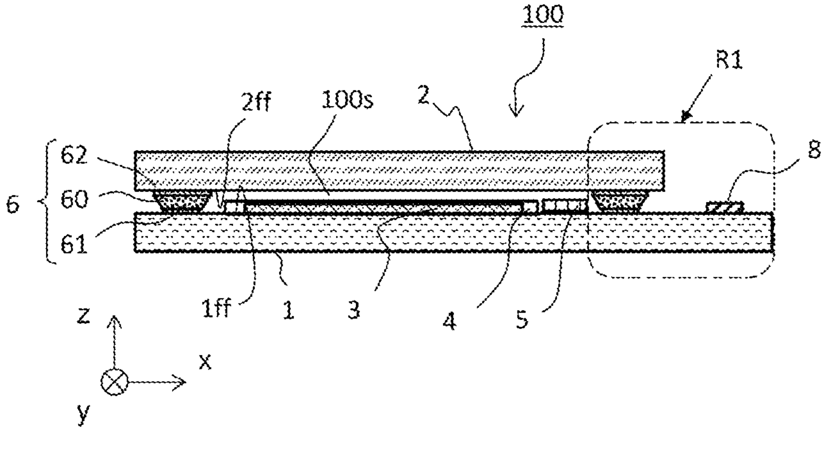
Figure 2:
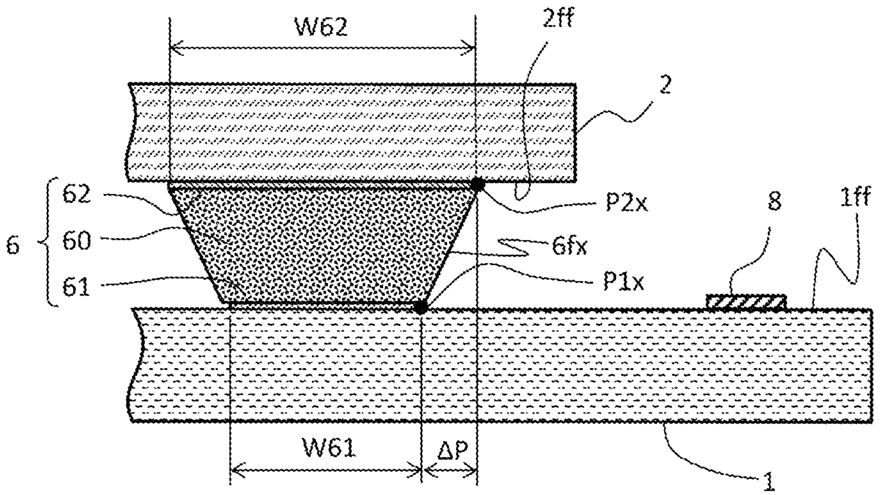
FIG. 2 is an enlarged partial cross-sectional view of a part of the hermetic package device according to Embodiment 1.
Figure 3:
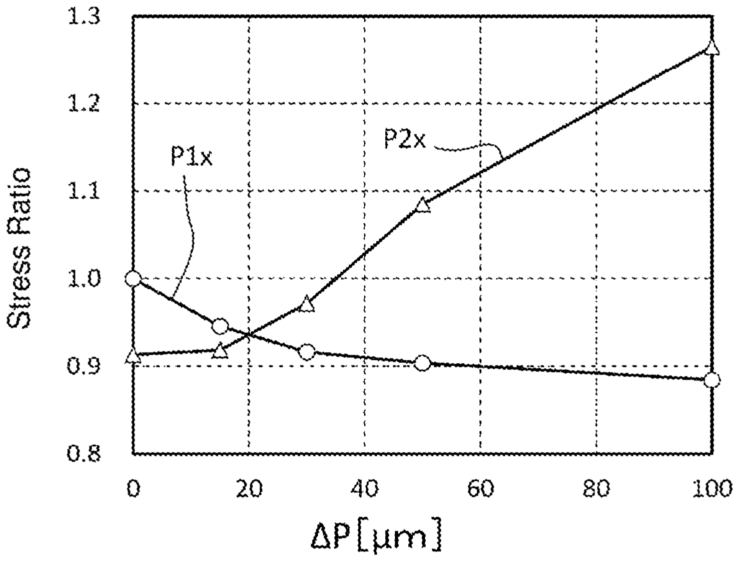
FIG. 3 is a graphical representation of a relationship between a dimension of a positional shift at an intersection point with a lid wafer with respect to an intersection point with a device wafer on an outer surface of a sealing part and stresses applied to those intersection points, in the hermetic package device.

FIG. 1A, FIG. 1B, FIG. 2, and FIG. 3 are for explaining a configuration of a hermetic package device according to Embodiment 1, FIG. 1A is a plan view in which a lid wafer portion of the hermetic package device is see-through, FIG. 1B is a cross-sectional view corresponding to the A-A line in FIG. 1A, and FIG. 2 is a partial cross-sectional view in which a region R1 in FIG. 1B is enlarged. FIG. 3 is a graphical representation of a relationship between a dimension of a positional shift at an intersection point with the lid wafer with respect to an intersection point with the device wafer on an outer surface of a portion in the sealing part facing an installation region of bonding pads and stresses applied to those intersection points.

First, a basic configuration of the hermetic package device will be is described. In the hermetic package device 100, as shown in FIG. 1A and FIG. 1B, a part of a device wafer 1 protrudes relative to a lid wafer 2, and flat surfaces (mounting surface 1*ff*, opposed surface 2*ff*) are placed in parallel to face each other and are bonded by a sealing part 6. The sealing part 6 is formed of a first under-layer 61 patterned in a closed curve shape on the mounting surface 1*ff* of the device wafer 1, a second under-layer 62 patterned in a closed curve shape on the surface of the lid wafer 2 (opposed surface 2*ff*), and a sealing material layer 60 interposed between them. Both the first under-layer 61 and the second under-layer 62 are patterned in the closed curve shape (ring-shaped) and are sometimes referred to as sealing rings.

The sealing material layer 60 is a solder material and has low wettability to the surface of the device wafer 1 (mounting surface 1*ff*) and the surface of the lid wafer 2 (opposed surface 2*ff*), making it difficult to bond the device wafer 1 and the lid wafer 2 as they are. Therefore, the first under-layer 61 and the second under-layer 62 are formed of a material with good wettability to the solder material and good adhesion to each wafer so as to function as an intermediate layer for bonding each wafer and the sealing material layer 60.

A hermetically sealed space 100*s* surrounded by the device wafer 1, the lid wafer 2, and the sealing part 6 is maintained in a vacuum atmosphere by the sealing part 6 formed in this way. In order to secure the vacuum volume, the sealing part 6 is formed with a thickness of about 50 to 150 μm, and in the present embodiment, it has a thickness of 100 μm. Although the inside of the hermetically sealed space 100*s* is in a vacuum atmosphere, it does not mean a complete vacuum, but only a degree of vacuum necessary to maintain the thermal insulation. If the pressure is lower than that of the outside air at least to an extent that it is a factor for the stress occurrence, the need to relieve the stress to be described later arises.

In the region inside the sealing part 6 of the device wafer 1, that is, in the hermetically sealed space 100*s*, an image sensing element 3 for infrared light, a scanning circuit 4, and a readout circuit 5 each are arranged and maintained in a vacuum atmosphere with excellent thermal insulation, thereby enhancing the reliability as the infrared sensor. Note that the MEMS and a semiconductor element that include the image sensing element 3, the scanning circuit 4, and the readout circuit 5 are collectively referred to as a semiconductor circuit 7. In addition, a plurality of bonding pads 8 (terminals) electrically connected to the image sensing element 3, the scanning circuit 4, and the readout circuit 5 via wiring (not shown) are arranged in a region of the device wafer 1 outside the sealing part 6 and in the part protruding relative to the lid wafer 2.

On the other hand, on the lid wafer 2, a gas adsorbent (not shown) called a getter for maintaining the degree of vacuum is formed at a portion surrounded by the second under-layer 62. In addition, a recess may be formed to increase the vacuum volume.

Further, an anti-reflection coating called an AR coating may be formed on the outer surface of the lid wafer 2 (the surface opposite to the opposed surface 2*ff*) to improve the infrared transmittance. When the bonding pads 8 of the hermetic package device 100 thus configured are electrically connected to a circuit board (not shown) or the like, with wires or the like, an device module 1000 (FIG. 11A, FIG. 11B) to be described later functions.

On the basis of the above configuration, a characteristic configuration of the hermetic package device 100 in the present application will be described. In the hermetic package device 100 of the present application, as shown in FIG. 2, a width W61 of the first under-layer 61 formed on the device wafer 1 is set to be narrower than a width W62 of the second under-layer 62 formed on the lid wafer 2. In Embodiment 1, at least in a portion facing the part of the device wafer 1 protruding relative to the lid wafer 2, the cross-sectional shape perpendicular to the extending direction of the sealing part 6 is an inverted trapezoid formed by connecting both ends of the first under-layer 61 and the second under-layer 62.

Next, in order to verify an effect of the inverted trapezoid, several kinds of test specimens were prepared using the dimension ΔP of the positional shift as a parameter, and results of reliability tests will be explained. The horizontal axis in FIG. 3 shows the dimension ΔP of the positional shift of an intersection point P2*x* with respect to an intersection point P1*x* in the portion facing the part of the device wafer 1 protruding relative to the lid wafer 2, the intersection point P2*x* being between an outer surface 6*fx* of the sealing part 6 and the surface of the lid wafer 2 (the opposed surface 2*ff*), the intersection point P1*x* being between the outer surface 6*fx* of the sealing part 6 and the surface of the device wafer 1 (the mounting surface 1*ff*). It is assumed that the first under-layer 61 and the second under-layer 62 are arranged with their centers aligned in a plan view (when viewed from a distant position in the z-direction). In other words, it is assumed that the inverted trapezoid with a symmetrical cross section is formed and the dimension ΔP of the positional shift is half the difference between the width W61 of the first under-layer 61 formed on the device wafer 1 and the width W62 of the second under-layer 62 formed on the lid wafer 2.

Further, the vertical axis shows each of the stresses at the intersection point P1*x* and the intersection point P2*x*, which is normalized by the stress at the intersection point P1*x* when the dimension ΔP of the positional shift is zero. Here, the first under-layer 61 and the second under-layer 62 are so-called nickel strikes having multilayer structures made of titanium (Ti) of 0.1 μm in thickness, copper (Cu) of 0.3 μm, and nickel (Ni) of 1 to 5 μm from the respective wafer sides. Then, assuming that the thickness of the sealing part 6 including these is 100 μm, the value of stress that occurs when a temperature change of −100 degrees C. is generated is used. Note that the thickness of the sealing part 6 of each test specimen was within the range of 90±20 μm.

As shown in FIG. 3, the test results obtained show that the stress at the intersection point P1*x* between the mounting surface 1*ff* of the device wafer 1 and the outer surface 6*fx* of the sealing part 6 decreases as the dimension ΔP of the positional shift increases from 0. On the other hand, the test results obtained show that the stress at the intersection point P2*x* between the opposed face 2*ff* of the lid wafer 2 and the outer face 6*fx* of the sealing part 6 increases, and when the dimension ΔP of the positional shift is larger than 40 μm, the stress ratio exceeds 1 and the stress at the intersection point P1*x* in the case of the dimension ΔP being zero is exceeded. In other words, by making the cross-sectional shape of the sealing part 6 inverted trapezoidal, the stress application direction in the vertical direction at the sealing part 6 inclines to the horizontal direction, and the stress concentration at the intersection point P1*x* is relieved.

In the case of a test specimen in which the dimension ΔP of the positional shift was 0, that is, an under-layer of the same width (W61=W62) was formed on each of the device wafer 1 and the lid wafer 2, a crack occurred in a portion at the intersection point P1*x* between the device wafer 1 and the outer surface 6*fx*, resulting in malfunction of the sensor. In contrast, no malfunction occurred in test specimens whose dimension ΔP of the positional shift was increased from 0 to 50 μm.

However, when the dimension ΔP of the positional shift exceeded 50 μm, a crack occurred in the lid wafer 2. The lid wafer 2 had no semiconductor circuit or wiring, and operated normally as the sensor. However, since there is a concern that a foreign object adheres to the device wafer 1 when the crack occur, the dimension ΔP of the positional shift is suitable to be larger than 0 μm and within a range of 50 μm or less, and can be freely selected within that range.

If the dimension ΔP of the positional shift is kept within the range of 5 to 30 μm, the stress value at both the intersection point P1*x* and the intersection point P2*x* can be made lower than that of the intersection point P1*x* of the case when the malfunction occurs, and the hermetic package device 100 with higher reliability can be obtained. In other words, the preferable range of the set value of the dimension ΔP of the positional shift is from 5 to 30 μm when taking into account the dimensional error in mass production.

The first under-layer 61 of the device wafer 1 and the second under-layer 62 of the lid wafer 2 in each embodiment of the present application each are formed by electrolytic Ni plating. The width W61 and the width W62 by electroplating are achieved using existing photolithography technology, and any desirable width can be selected by the pattern size of a photomask.

For example, if the mounting surface of the device wafer or the opposed surface of the lid wafer is provided with a inclination, it is possible to relieve the stress by blunting the angle with the outer surface of the sealing part without forming the inverted trapezoid. However, in such a case, using a device wafer or a lid wafer prepared by special processing such as forming an inclination in the mounting surface or opposed surface, individual packaging is required, and thus it is unsuitable for mass production.

In contrast, the hermetic package device 100 of the present application can be cut out after packaging collectively without any special processing such as forming the inclination on either the mounting surface 1*ff* or the opposed surface 2*ff*. That is, by forming the sealing part 6 with the inverted trapezoidal cross section, the device wafer 1 can be prevented from cracking and the highly reliable hermetic package device 100 can be obtained without impairing mass production efficiency.

Embodiment 2

Figure 4:
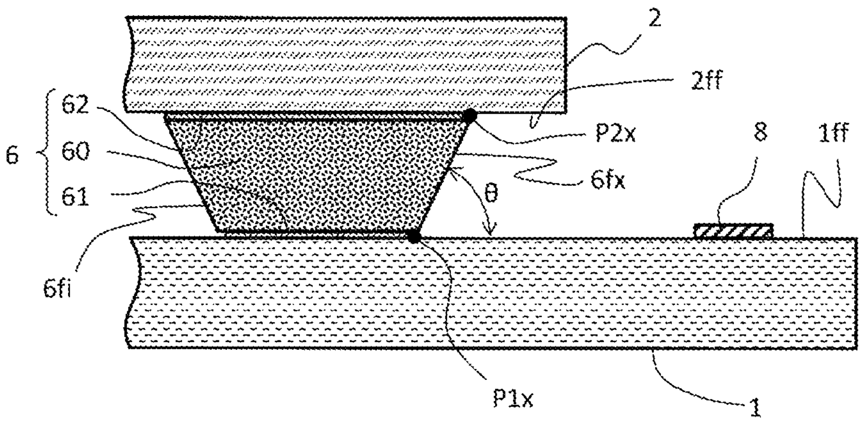
FIG. 4 is an enlarged partial cross-sectional view of a part of a hermetic package device according to Embodiment 2.
Figure 5:
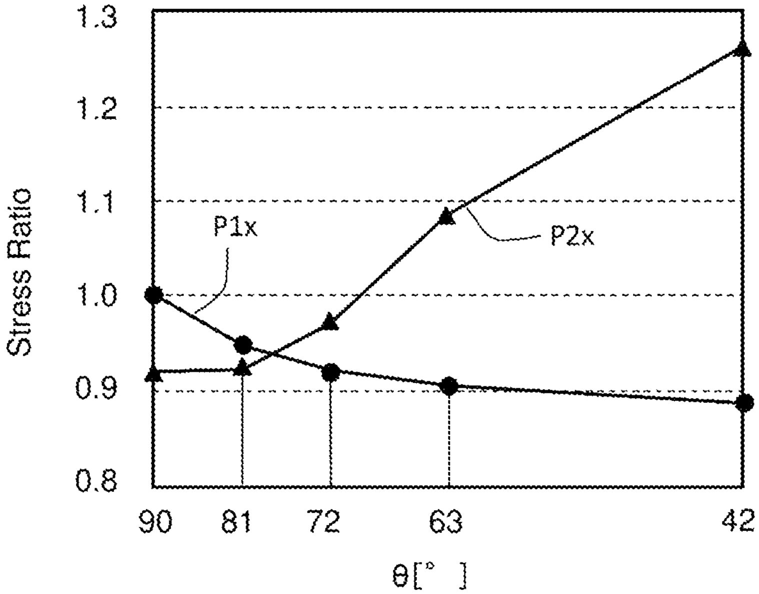
FIG. 5 is a graphical representation of a relationship between an angle formed by the outer surface of the sealing part with respect to the mounting surface of the device wafer and stresses applied to a position of an edge in a sealing ring on the lid wafer side and a position of an edge of a sealing ring on the device wafer side, in the hermetic package device.

In Embodiment 1 described above, an example of relieving the stress by adjusting the range of the dimension of the positional shift was described. In Embodiment 2, an example of relieving the stress by adjusting an inclination of the outer surface of the sealing part will be described. FIG. 4 and FIG. 5 are for explaining a configuration of a hermetic package device according to Embodiment 2, and FIG. 4 is a partial cross-sectional view of the hermetic package device corresponding to FIG. 2 in Embodiment 1. FIG. 5 is a graphical representation of a relationship between an angle of the outer surface of the portion in the sealing part facing the installation region of the bonding pads with respect to the mounting surface of the device wafer and stresses applied to the intersection points of the outer surface with both wafers.

As for the configuration of the hermetic package device according to Embodiment 2 other than the angle between the device wafer and the outer surface, the same configuration as that of Embodiment 1 can be applied, and the description of the similar part is omitted and FIG. 1A and FIG. 1B are referred to.

In the hermetic package device 100 according to Embodiment 2, as shown in FIG. 4, in order to examine an effect of the inverted trapezoidal shape, several test specimens are fabricated using an angle θ formed by the outer surface 6*fx* with respect to the mounting surface 1*ff* as a parameter, and results of the reliability test will be described. The horizontal axis in FIG. 5 shows the angle θ formed by the outer surface 6*fx* of the sealing part 6 with respect to the mounting surface 1*ff* at the part where the device wafer 1 protrudes relative to the lid wafer 2.

The vertical axis shows the stress at each of the intersection point P1*x* and intersection point P2*x*, normalized by the stress at the intersection point P1*x* when the angle θ is 90 degrees. Here, the first under-layer 61 and the second under-layer 62 have multilayer structures of titanium (Ti) of 0.1 μm in thickness, copper (Cu) 0.3 μm and nickel (Ni) 1 to 5 μm from the respective wafer sides, as in Embodiment 1.

As shown in FIG. 5, the test results obtained shows that the stress at the intersection point P1*x* between the device wafer 1 and the outer surface 6*fx* of the sealing part 6 decreases as the angle of the outer surface 6*fx* is changed to a side where the angle θ decreases from 90 degrees, i.e., the angle at the portion of the sealing part 6 at the intersection point P1*x* is blunted. On the other hand, the test results obtained shows that the stress at the intersection point P2*x* between the lid wafer 2 and the outer surface 6*fx* of the sealing part 6 increases, and when the angle θ is smaller than 60 degrees, the stress thereof exceeds that of the intersection point P1*x* in the case of the angle θ being 90 degrees. In other words, by making the cross-sectional shape of the sealing part 6 inverted trapezoidal, the stress application direction in the vertical direction at the sealing part 6 inclines to the horizontal direction, and stress concentration at the intersection point P1*x* is relieved.

In the case of a test specimen with an angle θ of 90 degrees, that is, with a rectangular cross section of the sealing part 6, a crack occurred at the portion of the intersection point P1*x* between the device wafer 1 and the outer surface 6*fx*, resulting in malfunction of the sensor. In contrast, no malfunction occurred in the test specimens with the angle θ decreased from 90 degrees.

However, when the angle θ was close to 40 degrees, a crack occurred in the lid wafer 2. The lid wafer 2 had no semiconductor circuit or wiring, and operated normally as a sensor. However, since there is a concern that a foreign object adheres to the device wafer 1 when cracks occur, the angle θ is suitable to be in the range of 60 degrees or more and less than 90 degrees, and can be freely selected within that range.

If the angle θ is kept within the range of 70 degrees or more and 85 degrees or less, both the stress values at the portion of intersection point P1*x* and the intersection point P2*x* can be made lower than the stress value of the intersection point P1*x* in the case where the malfunction occurred, and a more reliable hermetic package device 100 can be obtained. In other words, if dimensional errors and other factors at the time of mass production are also taken into consideration, the more favorable range of a set value of the angle θ is 70 degrees or more and 85 degrees or less.

The above results were similar to the case where the thickness of the sealing part 6 was changed or when the center positions of the first under-layer 61 and the second under-layer 62 were shifted. That is, by setting the angle θ of the outer surface 6*fx* with respect to the mounting surface 1*ff* within the range described above, it is possible to prevent the device wafer 1 from cracking and achieve the effect of obtaining a highly reliable hermetic package device 100 without impairing mass production efficiency.

The first under-layer 61 of the device wafer 1 and the second under-layer 62 of the lid wafer 2 in Embodiment 2 of the present application are respectively formed by electrolytic Ni plating. The width W61, the width W62, and the positional relationship thereof for defining the angle θ are achieved using existing photolithography technology, and it is possible to set a desirable angle θ by the pattern size of a photomask.

In addition, lead-free solder is used for the sealing material layer 60 in the hermetic package device 100 of the present application, and a desirable thickness of the sealing part 6 (including the thickness of the first under-layer 61 and the second under-layer 62) can be obtained by adjusting the amount of lead-free solder for use. Therefore, by adjusting each of the widths W61, W62 and each of the positions of the first under-layer 61 and the second under-layer 62, and the thickness of the sealing part 6, a desirable angle θ can be obtained.

Embodiment 3

Figure 6:
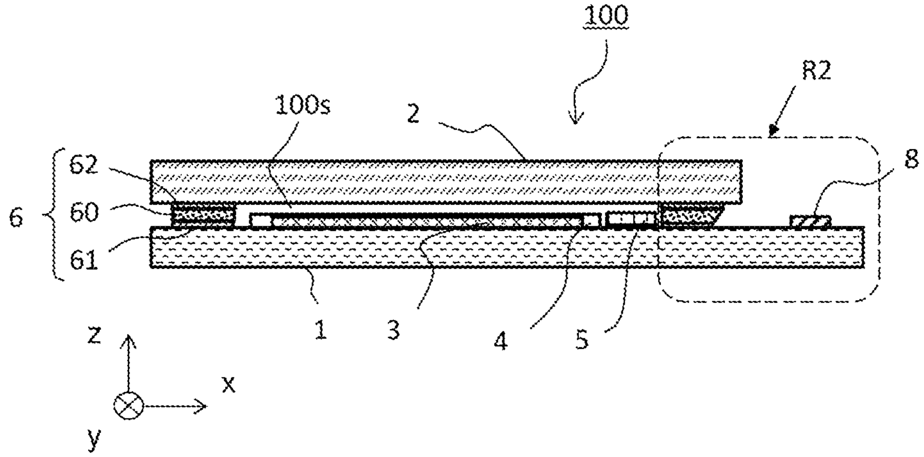
FIG. 6 is a cross-sectional view of a hermetic package device according to Embodiment 3.
Figure 7:
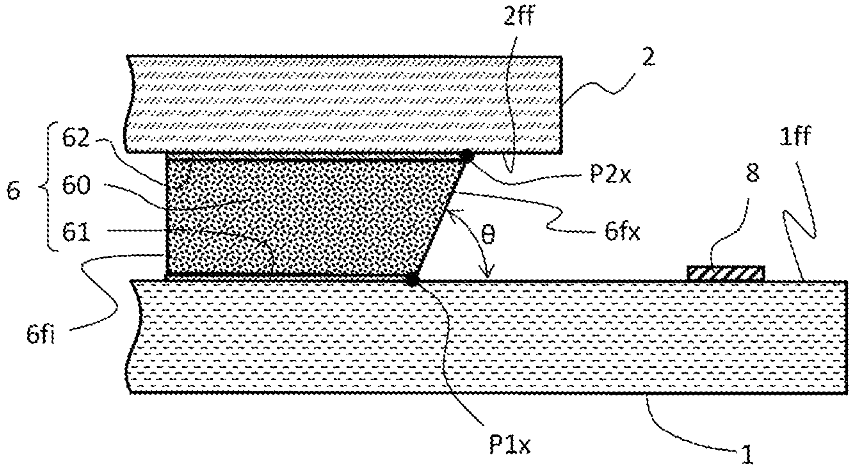
FIG. 7 is an enlarged partial cross-sectional view of a part of the hermetic package device according to Embodiment 3.

In Embodiment 1 or Embodiment 2 described above, the example of making the cross-sectional shape of the sealing part symmetrical and inverted trapezoidal has been described, but this is not a limitation. In Embodiment 3, an example will be described in which the inclination is provided only on the outer surface where the stress relief is necessary, and the inner surface is not intentionally inclined or is less inclined than the outer surface. FIG. 6 and FIG. 7 are for explaining a configuration of a hermetic package device according to Embodiment 3, FIG. 6 is a cross-sectional view of the hermetic package device corresponding to FIG. 1B in Embodiment 1, and FIG. 7 is a partial cross-sectional view in which a region R2 in FIG. 6 is enlarged.

Note that, except for the setting of a portion to which the inclination of the sealing part of the hermetic package device according to Embodiment 3 is to be provided, the same configuration as that in Embodiment 1 or Embodiment 2 can be applied, and the description of the same part is omitted and FIG. 1A, FIG. 3, and FIG. 5 are referred to.

As shown in FIG. 6 and FIG. 7, in the hermetic package device 100 according to Embodiment 3, the outer surface 6*fx* only for the sealing part 6 in a region of the device wafer 1 where the bonding pads 8 are arranged is inclined with respect to the device wafer 1. In the sealing part 6, in regions other than in the region where the bonding pads 8 are arranged, no inclination is intentionally provided for both the outer surface 6*fx* and an inner surface 6*fi*, as with a typical sealing part. In the region where the bonding pads 8 are arranged, the inner surface 6*fi* is perpendicular to the device wafer 1, but the same stress relief effect as in Embodiment 1 and Embodiment 2 can be obtained in accordance with a setting range of the dimension ΔP of the positional shift, or the angle θ formed with the mounting surface 1*ff*, which is caused by the inclination of the outer surface 6*fx*.

Furthermore, in the region where the bonding pads 8 are arranged, the width W61 of the first under-layer 61 of the device wafer 1 can be made larger by inclining the outer surface 6*fx* larger than the inner surface 6*fi* within the setting range, as compared with the case where both surfaces are inclined equally. It is effective when there is no room to reduce the width W61 of the first under-layer 61 on the device wafer 1 or when the width W62 of the second under-layer 62 of the lid wafer 2 cannot be enlarged, due to layout constraint of the semiconductor circuit 7.

The width W61 of the first under-layer 61 and the width W62 of the second under-layer 62 affect the hermeticity, and if they are too narrow, it may lead to deterioration of the hermeticity over time. However, for the portions where the device operation is not affected by a crack caused by the stress concentration, a nearly vertical structure is to be adopted in which inclination is not intentionally provided as in the case of a typical sealing part. Or, the inner surface 6*fi* is to be less inclined than the outer surface 6*fx*. By doing so, the hermetic package device 100 with high hermeticity and reliable device operation can be obtained without impairing mass production efficiency.

Embodiment 4

Figure 8:
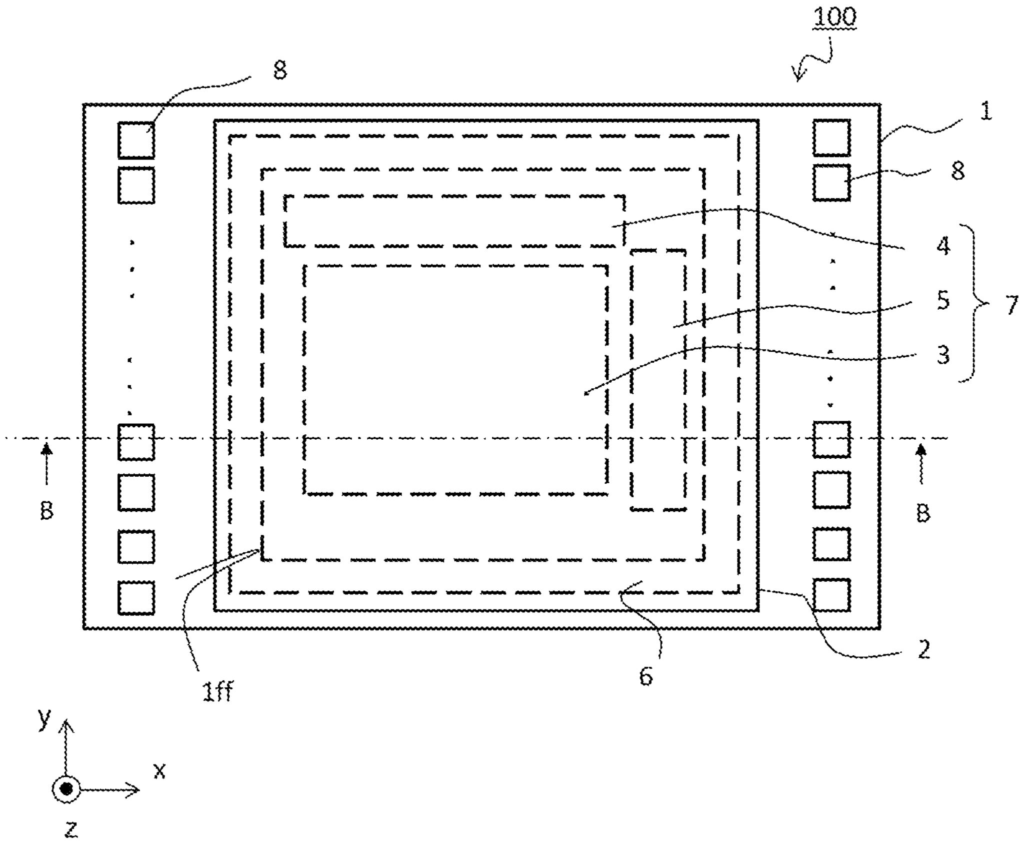
FIG. 8 is a partially transparent plan view of a hermetic package device according to Embodiment 4.
Figure 9:
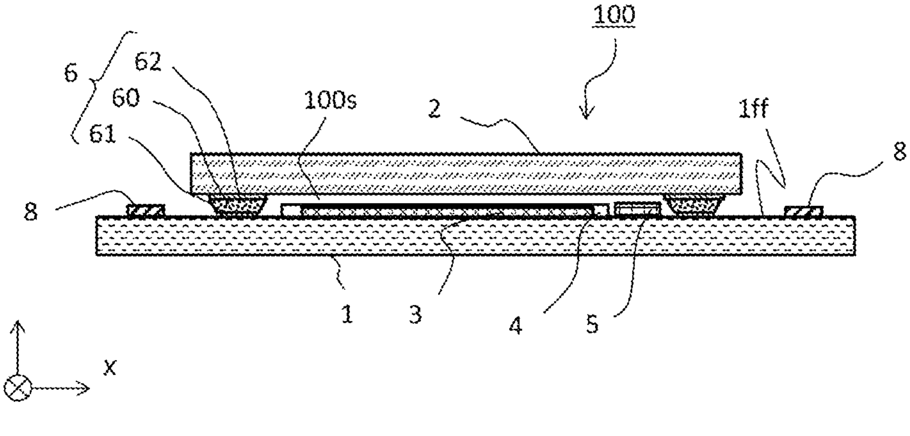
FIG. 9 is a cross-sectional view of the hermetic package device according to Embodiment 4.
Figure 10:
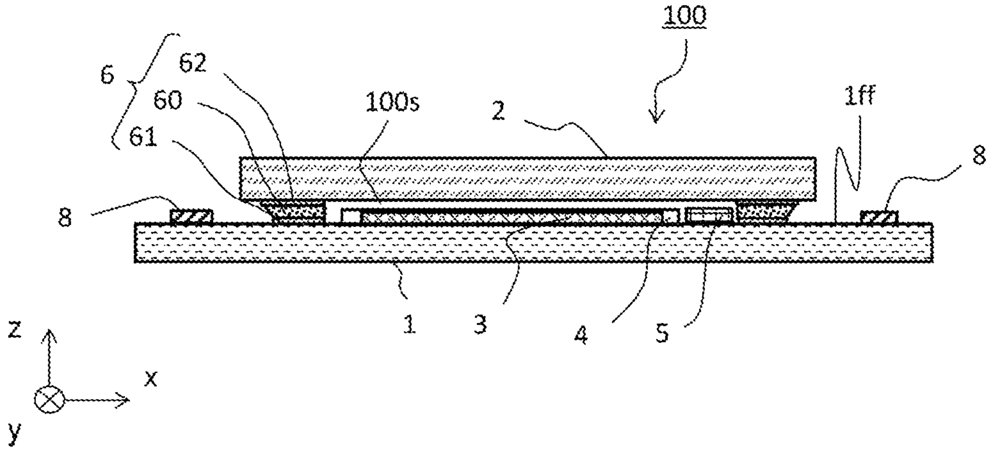
FIG. 10 is a cross-sectional view of a hermetic package device according to another example in Embodiment 4.

In Embodiment 1 to Embodiment 3 described above, the case where the bonding pads are provided on one side of the hermetic package device was described, but it is not a limitation. A case in which the bonding pads are provided on two or more sides of a hermetic package device will be described in Embodiment 4. FIG. 8 to FIG. 10 are for explaining a configuration of a hermetic package device according to Embodiment 4, FIG. 8 is a plan view in which a lid wafer portion of the hermetic package device is see-through, and FIG. 9 is a cross-sectional view corresponding to the B-B line in FIG. 8. And, FIG. 10 is a cross-sectional view corresponding to the B-B line of FIG. 8 in a hermetic package device according to another example in Embodiment 4.

In the hermetic package device according to Embodiment 4, as for the configuration except for the arrangement of the bonding pads and the setting of portions in relation to the arrangement, to which the inclination of the sealing part is to be provided, the same configuration as that of Embodiment 1 to Embodiment 3 can be applied, and the explanation of the similar part is omitted, and FIG. 2 to FIG. 6 are referred to.

In the hermetic package device 100 according to Embodiment 4, as shown in FIG. 8, the device wafer 1 protrudes relative to the lid wafer 2 on both sides in one direction (x-direction) of a plane (xy plane) parallel to the mounting surface 1*ff*, and bonding pads 8 are formed in each protruded region.

The cross-sectional shape of the portions of the sealing part 6 facing the region where the bonding pads 8 are formed is such that, for example, the inner surface 6*fi* and the outer surface 6*fx* are uniformly inclined in order for the shape to be inverted trapezoid as in Embodiment 1 or Embodiment 2, as shown in FIG. 9. Alternatively, as another example, as shown in FIG. 10, as in Embodiment 3, only the outer surface 6*fx* is inclined and the inner surface 6*fi* is not intentionally inclined.

Even when the bonding pads 8 are provided on multiple sides of the device wafer 1, the same effect as in Embodiment 1 and Embodiment 2 or Embodiment 3 can be achieved by providing the inclination as shown in FIG. 9 and FIG. 10 on the outer surface 6*fx* of the sealing part 6 on the sides provided with the pads. That is, even in the case of the hermetic package device 100 in which the bonding pads 8 are arranged on two or more sides, the effect of relieving the stress can be obtained by providing the inclination on the outer surface 6*fx* without impairing mass production efficiency.

Embodiment 5

Figure 11A:
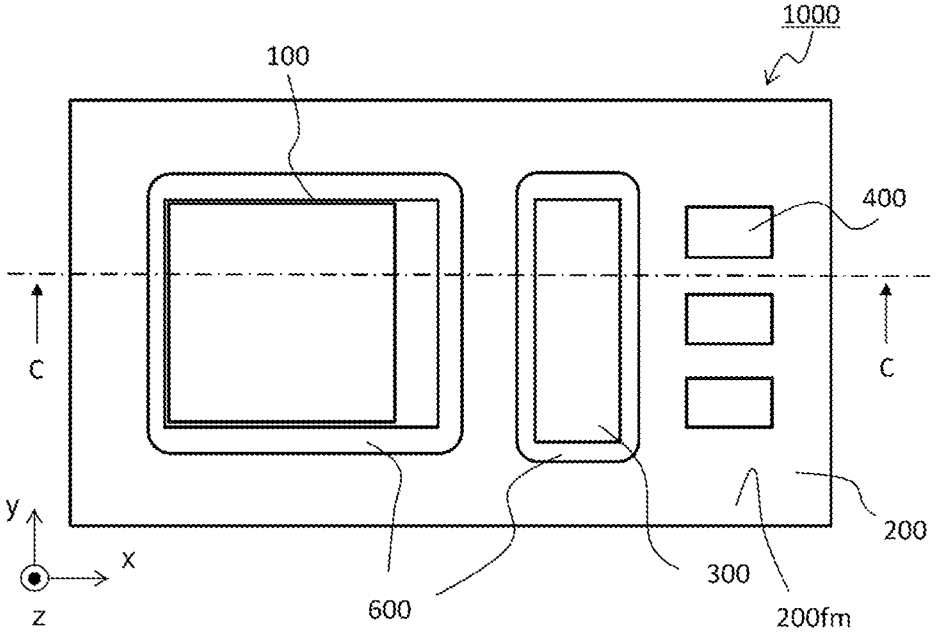
FIG. 11A and FIG. 11B are a plan view and a cross-sectional view, respectively, of a device module according to Embodiment 5.
Figure 11B:
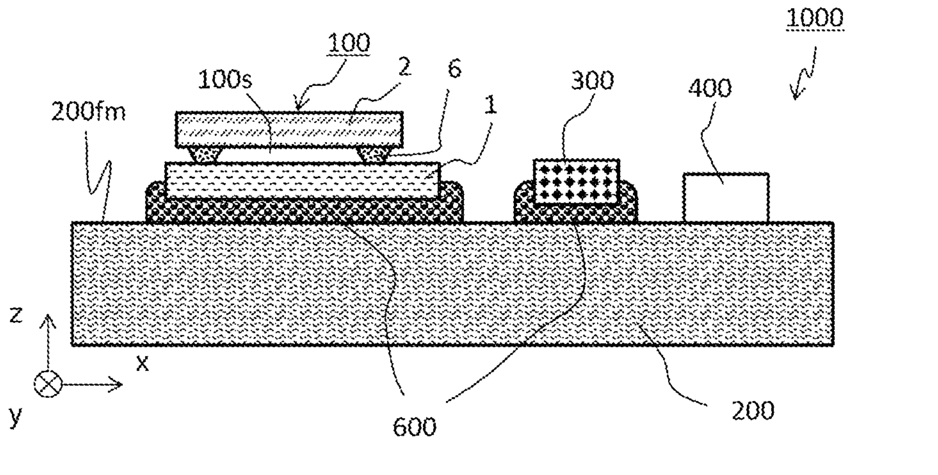

In Embodiment 5, a device module will be described in which the hermetic package device described above in Embodiment 1 to Embodiment 4 is mounted on a circuit board together with other electronic components. FIG. 11A and FIG. 11B are for explaining a configuration of the device module according to Embodiment 5, FIG. 11A is a plan view of the device module, and FIG. 11B is a cross-sectional view corresponding to the C-C line of FIG. 11A. Note that the configuration of the hermetic package device is the same as that of any of Embodiment 1 to Embodiment 4, the description of the same part is omitted, and FIG. 1A and FIG. 1B, and FIG. 2 to FIG. 10 will be referred to.

As shown in FIG. 11A and FIG. 11B, the device module 1000 according to Embodiment 5 has the hermetic package device 100, another semiconductor device 300, and electronic components 400 such as resistors and capacitors, which are mounted on a mounting surface 200*fin* of a circuit board 200. Then, components that are mounted are electrically connected by wire bonding or the like (not shown) to form the device module 1000. In Embodiment 5, the hermetic package device 100 and the semiconductor device 300 are fixed to the circuit board 200 using a thermosetting adhesive 600. In addition, parts, a cover, etc. necessary for the device are provided, although not shown.

The device module 1000 according to Embodiment 5 is equipped with the hermetic package device 100 described in any of Embodiment 1 to Embodiment 4 to be robust against vibration and shock. For example, when using the hermetic package device 100 that functions as an infrared sensor, it is possible to obtain a highly reliable infrared sensor that is robust against vibration and shock, and prevents cracking of the device wafer.

Note that, although various exemplary embodiments and examples are described in the present application, various features, aspects, and functions described in one or more embodiments are not limited to the application exemplified in a particular embodiment and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment disclosed are included.

The example of forming the first under-layer 61 and the second under-layer 62 using the electrolytic Ni plating have been described, but the electrolytic plating is not a limitation, and for example, electroless plating, a sputtering method, or a metal organic chemical vapor deposition (MO-CVD) method can be adopted as the forming method. In addition, the method of adjusting the width W61 of the first under-layer 61 and the width W62 of the second under-layer 62 using photolithography has been described. However, the photolithography is not a limitation, and a method of printing, inkjet, or mask sputtering can be employed.

Further, the example of setting the dimension ΔP of the positional shift, or the angle of inclination θ by the width W61 of the first under-layer 61 and the width W62 of the second under-layer 62 has been shown, but it is not a limitation. For example, if the mounting surface 1*ff* and the opposed surface 2*ff* themselves have affinity with the material constituting the sealing material layer 60, the cross-sectional shape (dimension ΔP of positional shift, angle θ) of the sealing part 6 may be set by forming a layer made of a non-affinity material outside the regions where the first under-layer 61 and the second under-layer 62 were assumed. Alternatively, the sealing material layer 60 may be selectively adhered to the mounting surface 1*ff* and the opposed surface 2*ff* by making the surface roughness of the regions where the first under-layer 61 and the second under-layer 62 were assumed to be formed larger than other portions.

Furthermore, although the example of using lead-free solder for the sealing material layer 60 has been described, the material of the solder is not limited to this, a desirable material can be selected, and the material of the under-layers can be changed accordingly. However, the lead-free solder is preferred to high-temperature solder or AuSn, because of its high environmental impact and a high price. In addition, although the example using the thermosetting adhesive 600 has been described for fixing the hermetic package device 100 and the semiconductor device 300, the material of the adhesive is not limited to this, and a desirable material can be selected. However, since a UV-cured type adhesive shrinks more during curing, the thermosetting type adhesive is more suitable.

As described above, the hermetic package device 100 according to the present application includes the device wafer 1 in which the semiconductor circuit 7 and the terminals (bonding pads 8) for electrical connection to an outside are provided on the mounting surface 1*ff*, the lid wafer 2 arranged to be opposed to the mounting surface 1*ff* of the device wafer 1, and the sealing part 6 that surrounds the installation region of the semiconductor circuit 7 in the mounting surface 1*ff*, is interposed between the device wafer 1 and the lid wafer 2, and forms the hermetically sealed space 100*s* in a vacuum atmosphere to house the semiconductor circuit 7 between the device wafer 1 and the lid wafer 2. The second installation region in the mounting surface 1*ff* in which the terminals (bonding pads 8) are provided protrudes relative to the lid wafer 2, and the outer surface 6*fx* of the portion in the sealing part 6 facing the second installation region is formed to be inclined such that a position thereon approaches the second installation region when getting closer from the device wafer 1 toward the lid wafer 2. Because of the above, it is possible to prevent the device wafer 1 from cracking and obtain a highly reliable hermetic package device 100 without impairing mass production efficiency.

In particular, when the sealing part 6 is formed of the first under-layer 61 patterned on the mounting surface 1*ff* of the device wafer 1, the second under-layer 62 patterned in the lid wafer 2 on the opposed surface 2*ff* of the mounting surface 1*ff*, and the sealing material layer 60 for filling between the first under-layer 61 and the second under-layer 62, and when, in the portion in the sealing part 6 facing the second installation region, the end of the second under-layer 62 on the side near the second installation region (intersection point P2x) has a positional shift toward the second installation region with respect to the end of the first under-layer 61 on the side near the second installation region (intersection point P1x), the above-mentioned inclination can be accurately formed.

In this case, if the dimension ΔP of the positional shift, is within the range of 50 μm or less, cracking of the device wafer 1 can be reliably prevented.

More preferably, if the dimension ΔP of the positional shift is within the range of 5 to 30 μm, cracking of the lid wafer 2 is also prevented and reliability is enhanced.

In addition, if lead-free solder is used for the sealing material layer 60 and nickel is used for the first under-layers 61 and the second under-layers 62, the cross-sectional shape of the sealing part 6 can be set reliably.

Alternatively, if the angle θ formed by the outer surface 6fx with respect to the mounting surface 1ff is within the range of 60 degrees or more and less than 90 degrees, cracking of the device wafer 1 can be reliably prevented.

More preferably, if the angle θ formed by the outer surface 6fx with respect to the mounting surface 1ff is within the range of 70 degrees or more and 85 degrees or less, cracking of the lid wafer 2 is also prevented and the reliability is enhanced.

When the inner surface 6fi of the portion in the sealing part 6 provided with the inclination in the outer surface 6fx is formed to be inclined at an angle gentler than the outer surface 6fx in the opposite direction with respect to the outer surface 6fx, or is upright to the mounting surface 1ff, the sealing width is secured to the extent possible and a highly reliable hermetic package device 100 can be obtained.

When the hermetic package device 100 described above is configured such that the image sensing element 3 for infrared light is used for the semiconductor circuit 7 and an infrared transmission material is used for the lid wafer 2 so as to function as an infrared sensor, a highly reliable infrared sensor can be obtained.

Furthermore, according to the device module 1000 of the present application, a highly reliable device module 1000 can be obtained because the module is configured to include the circuit board 200, the above-described hermetic package device 100 mounted on the circuit board 200, and electronic components (semiconductor device 300, electronic components 400) mounted on the circuit board 200 and electrically connected to the terminals (bonding pads 8).

DESCRIPTION OF REFERENCE NUMERALS AND SIGNS

1: device wafer, 1ff: mounting surface, 2: lid wafer, 2ff: opposed surface, 3: image sensing element, 4: scanning circuit, 5: readout circuit, 6: sealing part, 60: sealing material layer, 61: first under-layer, 62: second under-layer, 6fi: inner surface side, 6fx: outer surface side, 7: semiconductor circuit, 8: bonding pads (terminals), 100: hermetic package device, 100s: hermetically sealed space, 200: circuit board, 200fm: mounting surface, 300: semiconductor device, 400: electronic components, 1000: device module, P1x: intersection point, P2x: intersection point, W61: width, W62: width, ΔP: dimension (of positional shift), θ: angle.

The invention claimed is:

1. A hermetic package device comprising:

a device wafer in which a semiconductor circuit and terminals for electrical connection to an outside are provided on a mounting surface;

a lid wafer arranged to be opposed to the mounting surface of the device wafer; and a sealing part that surrounds an installation region of the semiconductor circuit in the mounting surface, is interposed between the device wafer and the lid wafer, and forms a hermetically sealed space in a vacuum atmosphere to house the semiconductor circuit between the device wafer and the lid wafer, wherein a second installation region in the mounting surface in which the terminals are provided protrudes relative to the lid wafer, and an outer surface of a portion in the sealing part facing the second installation region is inclined such that a position thereon approaches the second installation region when getting closer from the device wafer toward the lid wafer while the sealing part forms the hermetically sealed space.

2. The hermetic package device according to claim 1, wherein the sealing part is formed of a first under-layer patterned on the mounting surface, a second under-layer patterned in the lid wafer on an opposed surface of the mounting surface, and a sealing material layer for filling between the first under-layer and the second under-layer, and in the portion in the sealing part facing the second installation region, an end of the second under-layer on a side near the second installation region has a positional shift toward the second installation region with respect to an end of the first under-layer on a side near the second installation region.

3. The hermetic package device according to claim 1, wherein an angle of the outer surface with respect to the mounting surface is 60 degrees or more and less than 90 degrees.

4. The hermetic package device according to claim 2, wherein an angle of the outer surface with respect to the mounting surface is 60 degrees or more and less than 90 degrees.

5. The hermetic package device according to claim 3, wherein the angle of the outer surface with respect to the mounting surface is 70 degrees or more and 85 degrees or less.

6. The hermetic package device according to claim 4, wherein the angle of the outer surface with respect to the mounting surface is 70 degrees or more and 85 degrees or less.

7. The hermetic package device according to claim 1, wherein an inner surface of a portion in the sealing part provided with the inclination in the outer surface is inclined at an angle gentler than the outer surface in an opposite direction with respect to the outer surface, or is upright to the mounting surface.

8. The hermetic package device according to claim 1, wherein an image sensing element for infrared light is used for the semiconductor circuit and an infrared transmission material is used for the lid wafer so as to function as an infrared sensor.

9. A device module comprising:

a circuit board;

a hermetic package device according to claim 1; and electronic components that are mounted on the circuit board and are electrically connected to the terminals.

10. A hermetic package device comprising:

a device wafer in which a semiconductor circuit and terminals for electrical connection to an outside are provided on a mounting surface;

a lid wafer arranged to be opposed to the mounting surface of the device wafer; and a sealing part that surrounds an installation region of the semiconductor circuit in the mounting surface, is interposed between the device wafer and the lid wafer, and forms a hermetically sealed space in a vacuum atmosphere to house the semiconductor circuit between the device wafer and the lid wafer, wherein a second installation region in the mounting surface in which the terminals are provided protrudes relative to the lid wafer, an outer surface of a portion in the sealing part facing the second installation region is inclined such that a position thereon approaches the second installation region when getting closer from the device wafer toward the lid wafer, the sealing part is formed of a first under-layer patterned on the mounting surface, a second under-layer patterned in the lid wafer on an opposed surface of the mounting surface, and a sealing material layer for filling between the first under-layer and the second under-layer, in the portion in the sealing part facing the second installation region, an end of the second under-layer on a side near the second installation region has a positional shift toward the second installation region with respect to an end of the first under-layer on a side near the second installation region, and a dimension of the positional shift is 50 μm or less.

11. The hermetic package device according to claim 10, wherein the dimension of the positional shift is 5 μm or more and 30 μm or less.

12. The hermetic package device according to claim 10, wherein lead-free solder is used for the sealing material layer and nickel is used for the first under-layer and the second under-layer.

13. The hermetic package device according to claim 11, wherein lead-free solder is used for the sealing material layer and nickel is used for the first under-layer and the second under-layer.

14. The hermetic package device according to claim 2, wherein an inner surface of a portion in the sealing part provided with the inclination in the outer surface is inclined at an angle gentler than the outer surface in an opposite direction with respect to the outer surface, or is upright to the mounting surface.

15. The hermetic package device according to claim 2, wherein an image sensing element for infrared light is used for the semiconductor circuit and an infrared transmission material is used for the lid wafer so as to function as an infrared sensor.

16. A device module comprising:

a circuit board;

a hermetic package device according to claim 2; and electronic components that are mounted on the circuit board and are electrically connected to the terminals.

17. A hermetic package device comprising:

a device wafer in which a semiconductor circuit and terminals for electrical connection to an outside are provided on a mounting surface;

a lid wafer arranged to be opposed to the mounting surface of the device wafer; and a sealing part that surrounds an installation region of the semiconductor circuit in the mounting surface, is interposed between the device wafer and the lid wafer, and forms a hermetically sealed space in a vacuum atmosphere to house the semiconductor circuit between the device wafer and the lid wafer, wherein a second installation region in the mounting surface in which the terminals are provided protrudes relative to the lid wafer, an outer surface of a portion in the sealing part facing the second installation region is inclined such that a position thereon approaches the second installation region when getting closer from the device wafer toward the lid wafer, the sealing part is formed of a first under-layer patterned on the mounting surface, a second under-layer patterned in the lid wafer on an opposed surface of the mounting surface, and a sealing material layer for filling between the first under-layer and the second under-layer, in the portion in the sealing part facing the second installation region, an end of the second under-layer on a side near the second installation region has a positional shift toward the second installation region with respect to an end of the first under-layer on a side near the second installation region, and lead-free solder is used for the sealing material layer and nickel is used for the first under-layer and the second under-layer.

18. The hermetic package device according to claim 17, wherein an inner surface of a portion in the sealing part provided with the inclination in the outer surface is inclined at an angle gentler than the outer surface in an opposite direction with respect to the outer surface, or is upright to the mounting surface.

19. The hermetic package device according to claim 17, wherein an image sensing element for infrared light is used for the semiconductor circuit and an infrared transmission material is used for the lid wafer so as to function as an infrared sensor.

20. A device module comprising:

a circuit board;

a hermetic package device according to claim 17; and electronic components that are mounted on the circuit board and are electrically connected to the terminals.

* * * * *